(12) United States Patent
Listerud et al.

(10) Patent No.: US 6,288,543 B1
(45) Date of Patent: *Sep. 11, 2001

(54) METHOD AND APPARATUS FOR IMPROVED MAGNETIC RESONANCE IMAGING DATA ACQUISITION

(75) Inventors: John Listerud, Philadelphia; Robert Grossman, Haverford, both of PA (US)

(73) Assignee: The Trustees of the University of Pennsylvania, Philadelphia, PA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/706,185

(22) Filed: Aug. 30, 1996

(51) Int. Cl.$^7$ .................................................. G01V 3/00
(52) U.S. Cl. ............................................ 324/309; 324/307
(58) Field of Search ................................. 324/309, 307, 324/306, 314, 312

(56) References Cited

U.S. PATENT DOCUMENTS

| | | | |
|---|---|---|---|
| 5,329,231 | 7/1994 | Hatta et al. | 324/309 |
| 5,361,763 | 11/1994 | Kao et al. | 128/653.2 |
| 5,377,679 | 1/1995 | Machida et al. | 128/653.2 |
| 5,391,989 | 2/1995 | Takane et al. | 324/306 |
| 5,406,203 * | 4/1995 | Oh et al. | 324/309 |
| 5,422,576 | 6/1995 | Kao et al. | 342/309 |
| 5,498,962 | 3/1996 | Sepponen | 342/309 |
| 5,528,144 * | 6/1996 | Gullapalli et al. | |

OTHER PUBLICATIONS

G. M. Bydder, J. V. Hajnal, I. R. Young "Comparison of FLAIR Pulse Sequences with Heavily T2–Weighted SE Sequences in the Imaging of the Brain", *RSNA Abstracts*, pp. 151 (1992).

G. M. Bydder, J. M. Pennock, J. V. Hajnal, C. J. Baudouin, F. M. Cowan "Use of FLAIR Pulse Sequences in MR Imaging of the Brain in Infants and Children", *RSNA Abstracts*, pp. 281 (1992).

S. J. White, J. V. Hajnal, I. R. Young, G. M. Bydder "Use of Fluid–Attenuated Inversion–Recovery Pulse Sequence for Imaging the Spinal Cord", *MRM* 28, pp. 153–162 (1992).

J. V. Hajnal, D. J. Bryant, I. Kasuboski, P. M. Pattany, B. De Coene, P. D. Lewis, J. M. Pennock, A. Oatridge, I. R. Young and G. M. Bydder "Use of Fluid Attenuated Inversion Recovery (FLAIR) Pulse Sequences in MRI of the Brain", *JCAT* 16(6), pp. 841–844 (1992).

B. DeCoene, J. V. Hajnal, P. Gatehouse, D. B. Longmore, S. J. White, A. Oatridge, J. M. Pennock, I. R. Young and G. M. Bydder "MR of the Brain Using Fluid–Attenuated Inversion–Recovery (FLAIR) Pulse Sequences", *AJNR* 13, pp. 1555–1564 (1992).

A. Oatridge, J. V. Hajnal, F. M. Cowan, C. J. Baudouin, I. R. Young and G. M. Bydder "MRI Diffusion–Weighted Imaging of the Brain: contributions to Image Contrast from CSF Signal Reduction, use of a Long Echo Time and Diffusion Effects", *Clincal Radiology* 47, pp. 82 –90 (1993).

(List continued on next page.)

Primary Examiner—Louis Arana
(74) Attorney, Agent, or Firm—Woodcock Washburn Kurtz Mackiewicz & Norris LLP

(57) ABSTRACT

A method for improved magnetic resonance imaging is disclosed herein. This method includes the step of interleaving a first slice-selective inversion recovery pulse within two slice-selective echo trains resulting from two other slice-selective inversion recovery pulses generated prior to the first pulse during a rapid spin echo sequence. In other words, the first slice-selective inversion recovery pulse is generated after receiving a first slice-selective echo train resulting from a second slice-selective inversion recovery pulse generated prior to the first pulse and before receiving a second slice-selective echo train resulting from a third slice-selective inversion recovery pulse generated prior to the generation of the first pulse.

6 Claims, 4 Drawing Sheets

OTHER PUBLICATIONS

L. K. Coleman, B. A. Porter, J. Redmond III, D. O. Olson, G. K. Stimac, D. M. Dunning, K. E. Friedl "Early Diagnosis of Spinal Metastases by CT and MR Studies", *JCAT* 12(3), pp. 423 –426 (1988).

G. M. Bydder, I. R. Young "MR Imaging: Clinical Use of the Inversion Recovery Sequence", *JCAT* 9(4), pp. 659–675 (1985).

J. W. Thorpe, G. J. Barker, D. G. MacManus, I. F. Moseley, P.S. Tofts, D. H. Miller "Fast FLAIR of the Briain in Multiple Sclerosis: A Preliminary Comparison with Dual Echo Fast Spin Echo", *Institute of Neurology*, London, UK, pp. 543.

T. M. Simonson, D. L. Crosby, D. J. Fisher, J. C. Ehrhardt, L. S. Michalson, P. T. Nguyen, V. A. Magnotta, H. J. Lee, H. D. Nguyen, Y. Sato, W.T.C. Yuh "Echoplanar FLAIR in the Evaluation of Intracranial Lesions", *The University of Iowa College Of Medicine*, pp. 522.

A. W. Litt, M. D. and J. R. Moore, Ph.D. "Turbo–FLAIR Imaging of the Brain", *New York University Medical Center*, NY and *Siemens Medical Systems*, NJ, pp. 541.

C. Baratti, F. Barkhof, F. Hoogenrad, J. Valk "Fluid Attenuated Inversion Recovery (FLAIR) Sequence in Multiple Sclerosis: Contrast Parameters In A Steady State and Comparison with Spin Echo Sequences", *Depts. Of Diagnostic Radiology and Biomedical Engineering, Free University Hospital*, the Netherlands, *Dept. of Neuroradiology, Scientifc Institute S. Raffaele, University of Milan*, Italy, pp. 544.

T. Kato, H. Yamamouchi, S. Takashima, A. Iwasaki "Early Detection of Cortical and Suncortical Tubers in Tubers in Tuberous Scierosis Using Fluid–Attenuated Inversion Recovery MR Imaging", *Dept. of Mental Retardation and Birth Defect Research, Natl. Institute of Neuroscience and Dept. of Child Neurology, NCNP & Showa General Hospital*, Tokyo, Japan, pp. 545.

L. Stempel, D. C. Huddle, J. D. Rosenblum, J. Prager "Comparison of Proton Density Fast Spin Echo (PD FSE) and Fluid Attenuated Inversion Recovery (FLAIR) in the Evaluation of Multiple Sclerosis", *The University of Chicago Hospital*, Chicago, IL, pp. 542.

M. Maeda, S. Itoh, H. Yamada, T. Iwasaki, K. Yamamota, Y. Ishii, K. Torizuka "Comparison of the Fluid Attenuated Inversion Recovery (FLAIR) with Conventional MR Imaging in Cortical and Subcortical Lesions" *Dept. of Radiology, Fukui Medical School*, Fukui, Japan, pp. 538.

* cited by examiner

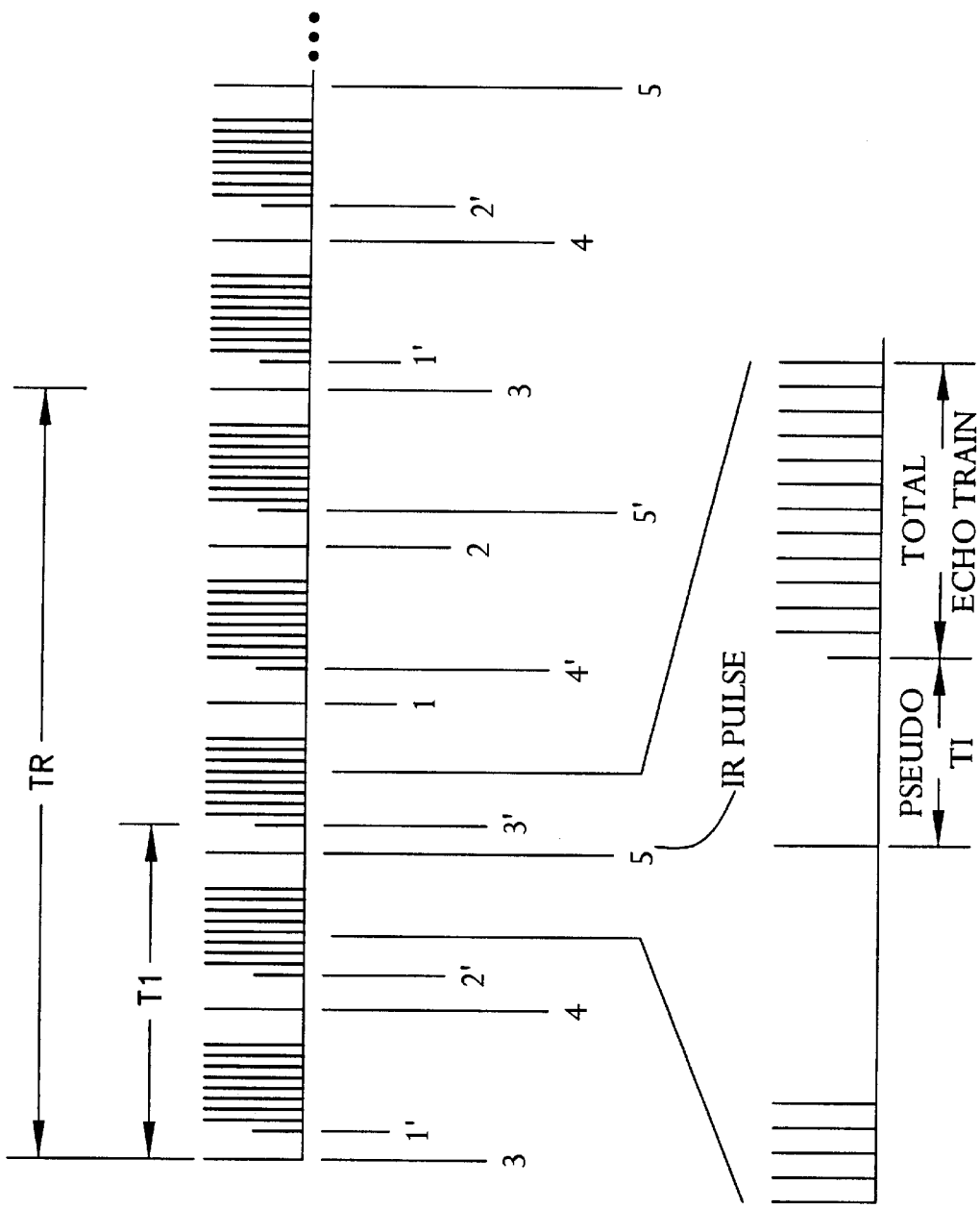

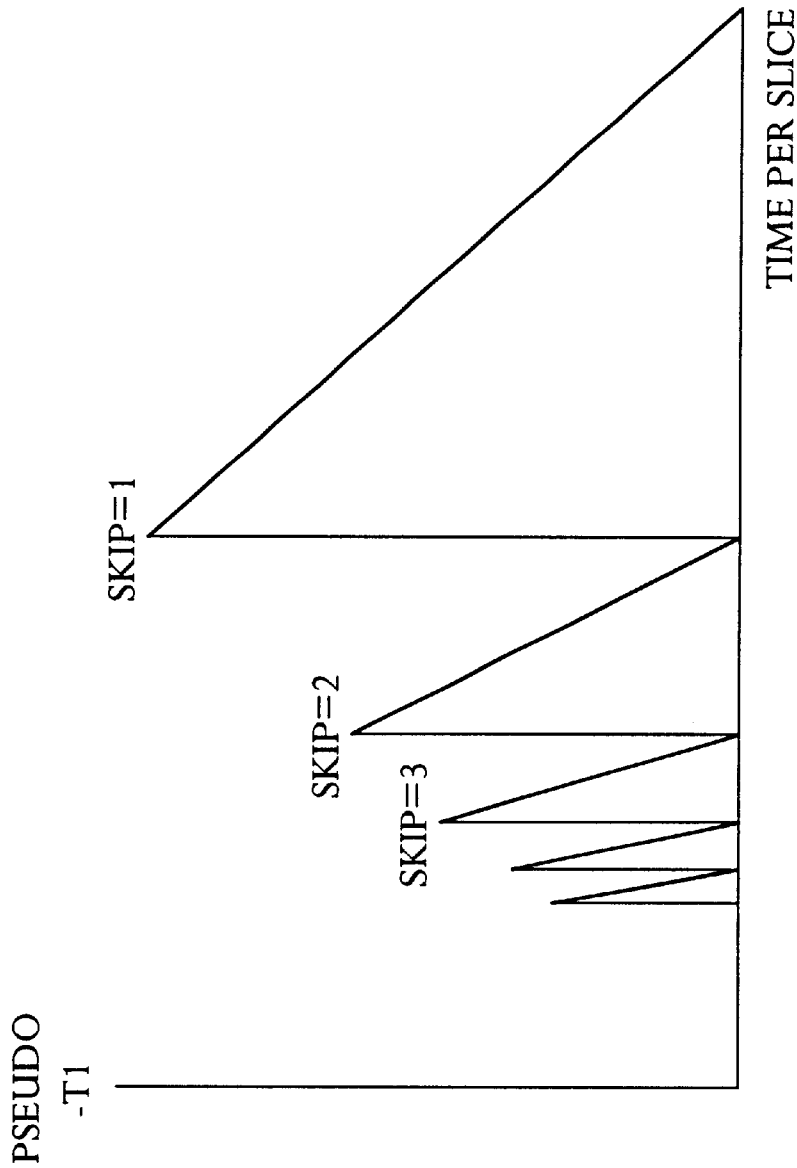

METHOD AND APPARATUS FOR IMPROVED MAGNETIC RESONANCE IMAGING DATA ACQUISITION

APPENDIX

Two exemplary copyrighted routines have been attached to the specification for disclosure purposes only. The disclosed routines cannot be used, copied, transmitted, etc., unless permission is sought from the owners of the copyright, the Trustees of the University of Pennsylvania.

FIELD OF THE INVENTION

This invention relates generally to methods and apparatus for magnetic resonance imaging and, more particularly, to methods and apparatus for magnetic resonance imaging data acquisition.

BACKGROUND OF THE INVENTION

Magnetic resonance imaging (MRI) is a clinically important medical imaging modality due to its exceptional soft-issue contrast. MRI scanners use the technique of nuclear magnetic resonance (NMR) to induce and detect a very weak radiofrequency signal that is a manifestation of nuclear magnetism. The term "nuclear magnetism" refers to weak magnetic properties that are exhibited by some materials as a consequence of the nuclear spin that is associated with their atomic nuclei. In particular, the proton, which is the nucleus of the hydrogen atom, possesses a nonzero nuclear spin and is an excellent source of NMR signals. The human body contains enormous numbers of hydrogen atoms, especially in water and lipid molecules.

The patient to be imaged must be placed in an environment in which several different magnetic fields can be simultaneously or sequentially applied to elicit the desired NMR signal. Every MRI scanner utilizes a strong static field magnet in conjunction with a sophisticated set of gradient coils and radiofrequency coils. The gradients and the radiofrequency components are switched on and off in a precisely timed pattern, or pulse sequence. Different pulse sequences are used to extract different types of data from the patient.

After scanning, MRI systems must provide a variety of mechanisms to create image contrast. If magnetic resonance images were otherwise restricted to water density, MRI would be considerably less useful, since most tissues would appear identical. Fortunately, many different MRI contrast mechanisms can be employed to distinguish between different tissues and disease processes.

The primary contrast mechanisms exploit the magnetization relaxation phenomena. The two types of relaxations are termed spin-lattice relaxation, characterized by a relaxation time $T_1$, and spin-spin relaxation, characterized by a relaxation time $T_2$.

Spin-lattice relaxation describes the rate of recovery of magnetization toward equilibrium after it has been disturbed by radiofrequency pulses. White matter has a shorter $T_1$ than gray matter, so it produces a stronger signal. The stronger signals then shows up brighter in an image. Because the image highlights the parts with shorter $T_1$, the image is "$T_1$-weighted."

Spin-spin relaxation describes the rate at which the NMR signal decays after it has been created. The signal is proportional to the transverse magnetization. White matter has a shorter $T_2$ than gray matter, so it produces a weaker signal. Conversely, cerebrospinal fluid (CSF) has a long $T_2$ and produces more signal. The stronger signals then shows up brighter in an image. Because the image highlights the parts with longer $T_2$, the image is "$T_2$-weighted."

CSF creates many difficulties when obtaining heavily $T_2$-weighted images. For example, image pixels in close proximity with CSF are at risk of obscuring subtle contrast differences by inclusion of partial volumes of bright CSF signals. Further distortions are also introduced by the flow of CSF during scanning. Accordingly, it may be difficult to detect subtle lesions or disease processes.

Several pulse sequencing techniques have been proposed to suppress the magnetic resonance signal of CSF in conventional and rapid spin echo imaging. One of these techniques is called Fluid Attenuation by Inversion Recovery (FLAIR). The first implementation of this technique includes generating a nonselective 180° pulse followed after a delay $T_{delay}$ by a complete multi-slice spin-echo sequence to produce a set of slices at different levels. The inversion time TI is equal to $T_{delay}$ for the first slice acquired and increased with successive slices. Sequence times are chosen so that the central slice has a TI appropriate for the null point of CSF (about 2200 ms at 1.0 T).

This approach is particularly useful with short echo times, since the slices are acquired in rapid succession over a short interval of time centered on the null point of the CSF magnetization. With longer echo times, the CSF signal is not completely nulled for the slices acquired at the start and finish of the multi-slice set, but, provided these were within approximately 500 ms of the null point, the CSF signal is still sufficiently reduced. In addition, the scans are insensitive to CSF flow distortions during the TI and TE periods since the CSF signal is suppressed. This technique provides an image that displays CSF as dark while maintaining strong $T_2$-weighing for the rest of the tissues.

However, because the $T_1$ of fluids can range on the order of two and three seconds, the TI required to obtain an inversion is also long. This constitutes a significant disadvantage of the FLAIR technique, as the increased acquisition time required to accommodate the longer inversion times (1500 ms and higher) prohibitively extends the scan time. Even with the use of rapid spin echo techniques to shorten FLAIR scan times, the sequence can require up to 20 minutes in order to obtain anatomic coverage of a volume acquired in approximately 6 minutes by conventional rapid spin echo sequences. These long imaging times reduce patient compliance as well as expend precious medical resources.

Accordingly, persons skilled in the art have attempted to obtain the same results with shorter scan times. One approach has been to interleave all pulses for the different slices in one time period and to receive the late slice-selective echo trains for the slices in another period. However, a time period between the pulses and the echo trains where nothing occurs, or "dead time," still exists. This, of course, minimizes the efficiency of the procedure. Therefore, while the FLAIR technique is faster than the prior techniques, it is still slow.

An approach to overcome these difficulties have been proposed by C. H. Oh et al. In this approach, 180° inversion pulses corresponding to different slices are interwoven with the conventional spin echo data acquisition sequence. However, using the conventional spin echo sequence as the basis for this procedure is problematic for several reasons. In conventional spin echo, the relaxation time period, or "TR," necessary for a slice to recover before being interrogated again is usually between 2000 and 2500 ms. However, executing FLAIR with such a short TR would result in very long times (20 to 30 minutes).

In addition, under the conventional spin echo technique, the MRI scanner cannot skip to other distant slices after exciting and scanning a slice. Accordingly, the scanned slices are distorted due to the concurrent CSF flow and/or cross-talk between slices.

It is the object of the present invention to provide a faster method for magnetic resonance imaging data acquisition that suppresses the CSF signal and an apparatus to carry out this method.

SUMMARY OF THE INVENTION

The object of this invention is met by a method comprising the step of interleaving a first slice-selective inversion recovery pulse within two slice-selective echo trains resulting from two other slice-selective inversion recovery pulses generated prior to the first pulse during a rapid spin echo sequence. In other words, the first slice-selective inversion recovery pulse is generated after receiving a first slice-selective echo train resulting from a second slice-selective inversion recovery pulse generated prior to the first pulse and before receiving a second slice-selective echo train resulting from a third slice-selective inversion recovery pulse generated prior to the generation of the first pulse.

Several benefits arise from performing the inventive method. First, because of the interleaving, the data acquisition time is substantially reduced in comparison with the time required for performing the FLAIR technique. Similarly, the data acquisition time is also substantially reduced when using a rapid spin echo sequence, instead of a conventional spin echo sequence.

The object of this invention is also met by an improved magnetic resonance imaging system comprising pulse generation means for generating slice-selective inversion recovery pulses, data acquisition means for acquiring data resulting from the generated pulses, and control means for controlling the pulse generation means and the data acquisition means so that a first slice-selective inversion recovery pulse is interleaved within two one slice-selective echo trains resulting from two other slice-selective inversion recovery pulses generated prior to the first pulse.

Persons skilled in the art will recognize that the inventive system shares some of the advantages and benefits obtained with the inventive method.

The invention will be better understood by those skilled in the art by reading the following detailed description in conjunction with the drawings.

BRIEF DESCRIPTION OF THE DRAWINGS

The accompanying drawings illustrate preferred embodiments of the invention according to the practical application of the principles thereof, and in which:

FIG. 1 is a diagram of the pulse sequence in relation to the received echo trains;

FIG. 3 is a graph showing pseudo-TI as a function of time per slice; and

DETAILED DESCRIPTION

The invention is now described with reference to the accompanying figures wherein like numerals designate like elements. FIG. 1 illustrates the pulse sequence in relation to the received echo trains resulting from a rapid spin echo pulse sequence. As shown in FIG. 1, the dead time between generated pulse and corresponding received echo train is equal to the inversion time, or "TI," e.g., the period between pulse 3 and the start of echo train 3'. This dead time can be minimized by generating other slice-selective inversion recovery pulses and other slice-selective echo trains within the TI.

For example, the slice-selective 180° inversion recovery pulse 5 is interleaved within a multi-slice sequence. In other words, pulse 5 is generated between the acquisition of two different slice echo trains (2' and 3'), resulting from two respective prior inversion recovery pulses 2 and 3.

While an effective dead time still exists during the time period between pulse 5 and the start of echo train 3', this effective dead time, or "pseudo-TI," is much shorter than the original TI. Accordingly, efficiency is improved as the effective dead time is decreased. Therefore, by interleaving the inversion recovery pulse, it is possible to acquire FLAIR contrast in any spin echo pulse sequence in virtually the same time as without the inversion pulse.

A person skilled in the art would recognize that it is preferable to pack the TI is packed within the TR, i.e., the relaxation time period necessary for a slice to recover before being interrogated again. The resulting increase in efficiency may then be estimated by the number of slices skipped between inversion and data acquisition of a particular slice, i.e., the "skip factor."

Figure 2A:
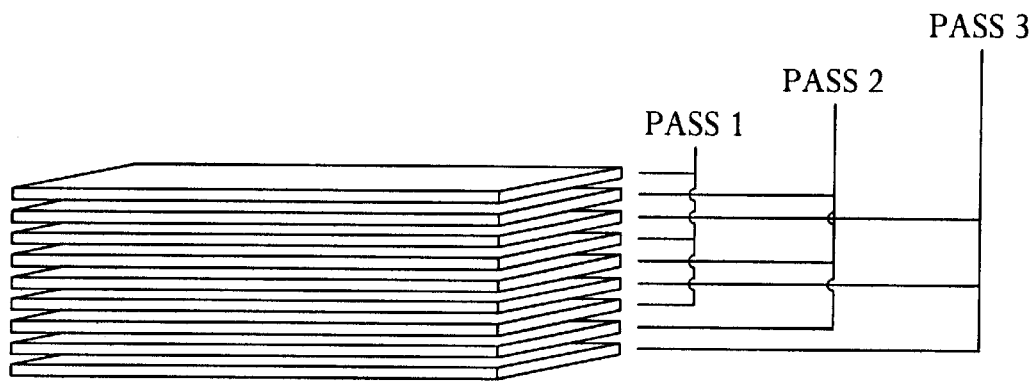
FIG. 2A is a diagram of the slice list division.
Figure 2B:
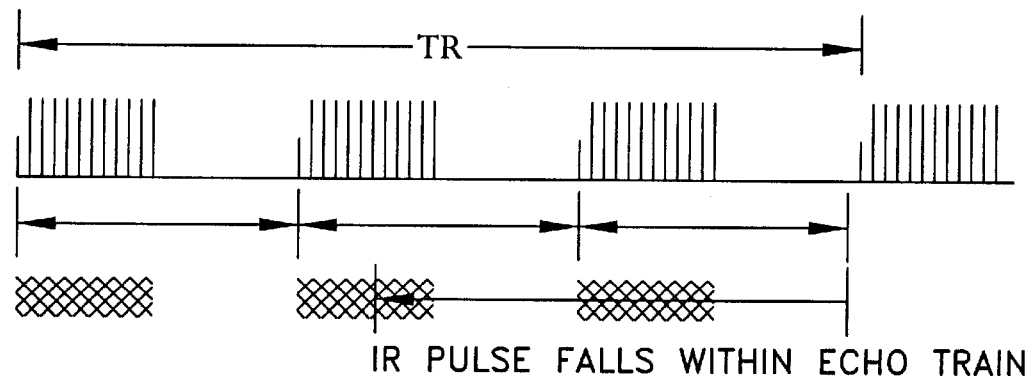
FIGS. 2B and 2C are diagrams of two different TR-TI packing strategies.
Figure 2C:
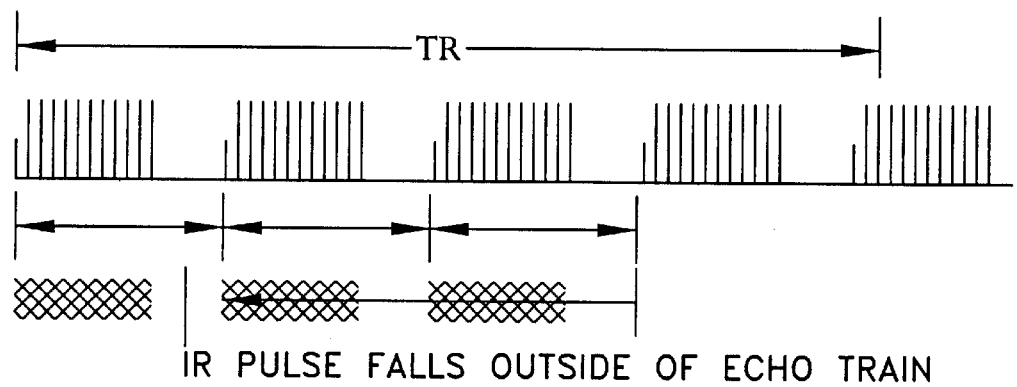

A person skilled in the art would also recognize that the pulse must be sent between echo trains, as shown in FIG. 2C, and not during an echo train, as shown in FIG. 2B.

Many computer routines can be used to ensure that these conditions are met. The following exemplary routines were implemented on a General Electric Medical Systems (GEMS) 5.xMR scanner. The Fast Spin Echo pulse sequence was modified using the GE Signa epic pulse programming language installed on an IPX (Sun Microsystem's Sparc 4/50) running SunOs 4.1.2. A person skilled in the art will recognize that the epic language is substantially the C programming language supported by an additional pre-processor.

The first exemplary routine (Interleaved FLAIR, or IL FLAIR) checks a series of cases among which at least one TR-TI packing solution is guaranteed to exist using parameters entered by the technician and/or calculated by different routines. The cases are distinguished by the number of passes required to cover the entire slice list.

Prior to running the routine, the technician may enters several parameters, including the TE, the TI, the TR, the matrix size, the number of slices, the echo train length, etc. Otherwise, default parameters may be used.

First, the interleaving routine calls a standard product manufacturer multi-slice routine in order to divide the slice list into separate passes, thus providing a number of passes (P). An illustration of this division is shown in FIG. 2A. The routine also calls the manufacturer's routine for computing the slices per pass, providing a number of slices per pass (S). A temporary time per slice ($T_{STemp}$) is calculated as follows:

$T_{STemp} = TR_A/S$;

wherein $TR_A$ is the actual TR.

A temporary TI ($TI_{Temp}$) is then calculated as follows:

$TI_{Temp} = TI_A/T_{STemp}$;

wherein $TI_A$ is the actual TI.

The routine then checks to whether the $T_{STemp}$ is equal to or greater than the sum of $TI_{Temp}$ and the echo train time. If so, the pseudo-TI is made equal to the $TI_{Temp}$. In addition, the slice skip factor (SSF) is then calculated as follows:

$SSF = TI_A/T_{STemp}$.

Finally, the time per slice is made equal to $T_{STemp}$.

In other words, the prescribed TI is checked to determine whether the inversion recovery pulse will be positioned within the echo trains. The process is repeated until a predetermined minimum of passes is reached. At the end of the routine, the solution with the least number of passes has been selected and is then used to control the MRI system accordingly.

The second exemplary routine (Optimized Interleaved FLAIR, or OIL FLAIR) is more complex. Accordingly, the persons skilled in the art are referred to Appendix and to the following brief functional description. This routine packs iteratively the TI with increasing numbers of skip slices for each number of passes. The pseudo-TI and time per slice are calculated for each slice skip number, using, for example, a non-linear equation represented by the graph in FIG. 3. Knowing the time per slice and the number of slices per pass, the TR is then calculated and checked to exceed the prescribed minimum TR. The result is checked for self consistency. The most time efficient solution is then selected. Accordingly, at run time, the carrier frequency for the inversion recovery pulse preceding the Nth slice is set to equal that of N+S slice, where S is the slice skip factor.

Because of the number of variables involved, it is preferable to allow a parameter to "float" within defined limits in order to achieve higher density packings. For example, a TR may be provided to ensure complete relaxation is sufficient for $T_2$-weighed FLAIR contrast. A person skilled in the art may recognize that this TR would be at least 5000 ms using the system described below.

This routine was programmed on a 5.xSigna MRI scanner. The CSF null point was determined using the fast gradient echo pulse sequence (TR<10 ms) with an inversion recovery preparation pulse and centric ordered phase encoding, giving image contrast with an effective TR of infinity. In addition, the routine was also run with the following parameters: TE of 17 ms; TR of 5000 ms; TI of 1500 ms; 256×192 matrix; 8 echo train length; and 20 slices.

The simulated scan times for FLAIR, Interleaved FLAIR and Optimized Interleaved FLAIR are listed in Table I. The results indicates a significant time savings of the interleaved FLAIR and optimized interleaved FLAIR techniques over the original FLAIR technique.

TABLE I

| Pulse Sequence | Skip Factor | Number of Passes | TR (ms) | Scan Time (min) |
|---|---|---|---|---|
| FLAIR | 0 | 7 | 5000 | 14:00 |
| IL FLAIR | 2 | 3 | 5000 | 6:30 |
| OIL FLAIR* | 2 | 2 | 5503 | 4:46 |
| OIL FLAIR | 5 | 1 | 5503 | 2:23 |

*This sequence is constrained to a minimum of two passes in order to eliminate cross-talk between slices These times and time savings increase proportionally for increased signal averaging and phase encoding, and correspond closely to scan times obtained on the actual scanner. For example, in a standard clinical protocol, oversampling is used in the phase encoding direction to eliminate phase warp artifacts. This in effect doubles the matrix size, making the scan times 28:00 and 4:46 minutes for rapid spin echo FLAIR and OIL FLAIR, respectively.

Figure 4:
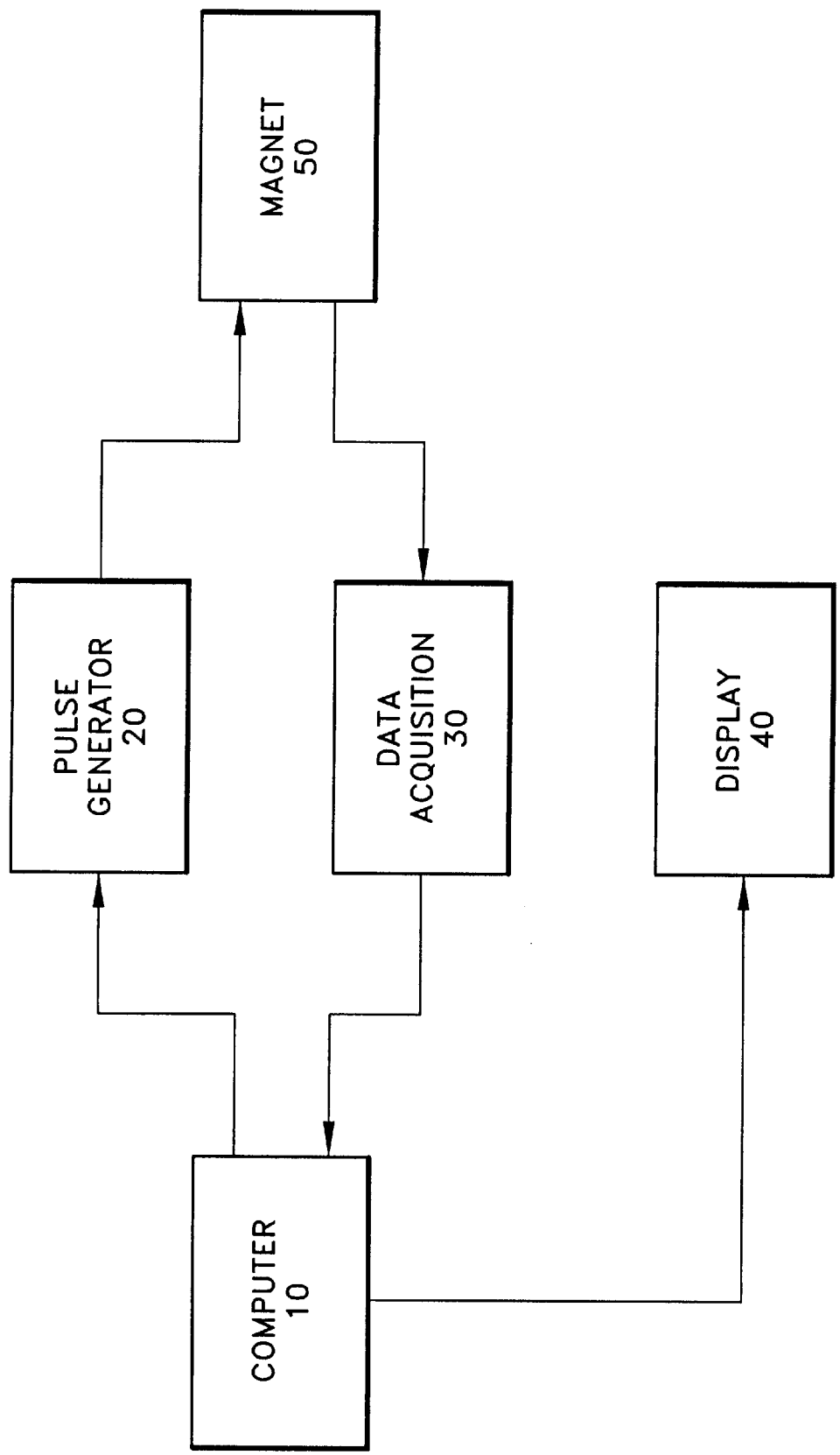
FIG. 4 is a block diagram of an embodiment of the MRI system.

FIG. 4 is a block diagram of an MRI system that would carry out the described method and routines. Its main elements are a computer 10, a pulse generator 20, a data acquisition element 30, a display 40 and a magnet 50. A person skilled in the art will recognize that the different elements are well known in the art and thus require no explanation as to their construction. In addition, the computer 10 has been programmed, or can be programmed, to carry out the described method or routines.

While the invention has been described in terms of the foregoing specific embodiments thereof, it will be apparent to those skilled in the art that various alterations and modifications may be made to the described embodiments without departing from the scope of the invention, as defined by the appended claims. They are nevertheless considered equivalent to the present invention.

Appendix

```
/****************************************************************/
/* InterLeaved FLAIR:                                           */
pseudo_ti        = actual_ti      /* Initialize these variables */
slice_skip_factor = 0;
/* manufacturer's routine for computing the slices_per_pass.*/
maxslquant (&slices_per_pass, technician_tr, actual_ti + echo_train_time;)
/* manufacturer's routine for computing num_passes, num of passes   */
maxpass ( &num_passes, total_slices, slices_per_pass);
do    /* loop from num_passes = maximum (i.e. = total_slices) down to 1  */
{
    /* manufacturer's routine for computing the slices_per_pass       */
    slicein1 ( &slices_per_pass, num_passes) )                        */
    time_per_slice_temp              = actual_tr/slices_per_pass;
    tmp_ti                           = actual_ti %time_per_slice_temp;
    if (time_per_slice_temp          >= tmp_ti + echo_train_time )
    {   pseudo_ti = tmp_ti;
        slice_skip_factor            = actual_ti / time_per_slice_temp;
        time_per_slice               = time_per_slice_temp;
    }
    num_passes = num_passes -1;
} while (    num_passes    >=minimum_num_passes, );
/****************************************************************/
/* OIL FLAIR: This routine performs the optimization called the    */
/* Optimized Inter-Leaved routine.
```

-continued

Appendix

```
num_passes                    = total_slices;
time_per_slice                = technician_tr;
num_passes_tr                 = num_passes*technician_tr;
do
{ tmp_tr = actual_tr;
    /* Manufacturer's routine computing number of slices_per_pass    */
    slicein1( &slices_per_pass, num_passes) )
    i = -1; /* Vary i through all possible slice skip factors        */
    do
    { i              = i + 1;
        time_per_slice_temp    = technician_tr/slices_per_pass;
        time_per_slice_temp    = Max( time_per_slice,
                                      actual_ti + echo_train_time)/(i+1));
    tmp_ti                     = actual_ti % time_per_slice_temp;
    tmp_tr                     = time_per_slice_temp * slices_per_pass;
    /* Manufacturer's routine limiting # slices according
            to Specific Absorption Rate.
    maxslicesar( &max_slice_allowed_by_sar, tmp_tr)
    if (
    /*      These conditions test whether these sequence
            parameters are self consistent.                            */
    tmp_ti                     > minimum_ti_time                  &&
    time_per_slice_temp        >= tmp_ti + echo_train_time        &&
    actual_ti                  >= i*time_per_slice_temp           &&
    tmp_tr                     >= technician_tr                   &&
    slices_per_pass            <= max_slice_allowed_by_sar        &&
    /* This condition tests to see that the solution is
            more efficient than previous solutions                    */
    num_passes*actual_tr       <= minimum_scan_time               )
    {
        pseudo_ti              = tmp_ti;
        slice_skip_factor      = i;
        time_per_slice         = time_per_slice_temp;
        minimum_scan_time      = num_passes*actual_tr;
    }
    } while ( i <= (actual_ti/echo_train_time -1));
    num_passes     = num_passes -1;
} while ( num_passes >= minimum_num_passes );
```

What is claimed is:

1. A method for improved magnetic resonance imaging data acquisition comprising the step of interleaving a first slice-selective inversion recovery pulse within two slice-selective echo trains resulting from two other slice-selective inversion recovery pulses generated prior to said first pulse during a rapid spin echo sequence; and generating a pseudo-TI, slice skip factor and time per slice parameters for use in said interleaving step.

2. The method of claim 1, further comprising the steps of:

calculating a TR; and verifying that the calculated TR is at least equal to a predetermined TR.

3. The method of claim 2, wherein the predetermined TR is at least 5000 ms.

4. The method of claim 1, wherein the interleaving step further comprises the step of generating a first slice-selective inversion recovery pulse after receiving a first slice-selective echo train resulting from a second slice-selective inversion recovery pulse generated prior to said first pulse and before receiving a second slice-selective echo train resulting from a third slice-selective inversion recovery pulse generated prior to the generation of said first pulse.

5. An improved magnetic resonance imaging system comprising:

pulse generation means for generating slice-selective inversion recovery pulses;

data acquisition means for acquiring data resulting from said generated pulses;

control means for controlling said pulse generation means and said data acquisition means so that, during a rapid spin echo sequence, a first slice-selective inversion recovery pulse is interleaved within two slice-selective echo trains resulting from a second and third slice-selective inversion recovery pulses generated prior to said first pulse, said control means controlling said pulse generation means and said data acquisition means so that said first pulse is generated after receiving a first slice-selective echo train resulting from said second pulse generated prior to said first pulse and before receiving a second slice-selective echo train resulting from said third pulse generated prior to said first pulse.

6. The system of claim 5, wherein said control means controls said pulse generation means and said data acquisition means so that said first pulse is generated after receiving a first slice-selective echo train resulting from said second pulse generated prior to said first pulse and before receiving a second slice-selective echo train resulting from said third pulse generated prior to said first pulse.

* * * * *